United States Patent [19]
Goth

[11] 3,731,823
[45] May 8, 1973

[54] WAFER TRANSPORT SYSTEM

[75] Inventor: George R. Goth, Jericho, Vt.

[73] Assignee: International Business Machines Corporation, Armonk, N.Y.

[22] Filed: June 1, 1971

[21] Appl. No.: 148,371

[52] U.S. Cl. ....................214/6 F, 198/35, 214/6 DS, 302/31

[51] Int. Cl. ....................B65g 57/11

[58] Field of Search ....................302/2 R, 17, 26, 302/29, 31; 214/6 F, 6 DK, 6 DS, 6 G; 198/35

[56] References Cited

UNITED STATES PATENTS

| | | | |
|---|---|---|---|
| 3,340,672 | 9/1967 | Kayser | 214/6 G X |
| 3,391,777 | 7/1968 | Joa | 198/35 |
| 2,917,991 | 12/1959 | Segur | 214/6 F |
| 3,408,063 | 10/1968 | Fabrig | 271/74 X |
| 3,210,124 | 10/1965 | Niemi et al. | 302/2 R |
| 3,460,685 | 8/1969 | Kirkhof | 302/2 R X |
| 3,243,181 | 3/1966 | Lyman | 271/74 X |
| 2,991,893 | 7/1961 | Kirsch et al. | 271/74 UX |
| 3,588,176 | 6/1971 | Byrne et al. | 302/2 R |
| 3,159,398 | 12/1964 | Buccicone | 271/74 X |

*Primary Examiner*—Robert J. Spar
*Attorney*—Hanifin & Jancin and Willis E. Higgins

[57] ABSTRACT

A transport system for semiconductor wafers and similar articles includes a transporter for the wafers, apparatus which introduces wafers to the transporter at one of its ends, a receiver for the wafers at the other end of the transporter, and apparatus for stacking two wafers during their passage along the transporter between the introducing apparatus and the receiver. The transporter is desirably an air slide, and a first wafer is stopped within the air slide by detaining pins that may be moved into the wafer path. A second wafer is then deflected by vertical air jets to lift it over the first wafer, where it is then stopped by the detaining pins and settles gently on top of the first wafer. If the air slide is bi-directional, the system may also include a wafer unstacker which receives the wafers from the receiver, then returns them to the introducing apparatus. This may be done with detaining pins of the same type used in the stacking apparatus and a Bernoulli pickup to restrain one of the wafers during unstacking. Such a system allows integrated circuit wafers to be stacked and unstacked without contacting a surface on each wafer in which the integrated circuits are being manufactured.

8 Claims, 6 Drawing Figures

Patented May 8, 1973 3,731,823

2 Sheets-Sheet 1

INVENTOR
GEORGE R. GOTH

BY *Willis E. Higgins*

ATTORNEY

WAFER TRANSPORT SYSTEM

BACKGROUND OF THE INVENTION

1. Field of the Invention

This invention relates to an article transport system in which the articles are stacked or unstacked during their passage through the system. More particularly, it relates to a transport system for wafers in which the wafers are stacked during their path of travel through the system. The invention also contemplates a system in which this procedure may be reversed to unstack the wafers. As used herein, the term "wafer" refers to essentially any substantially flat, plate-like, or sheet-like article. The term "semi-conductor wafer" refers to a slice of silicon or other suitable semiconductor material, typically having the thickness of about one sixty-fourth inch, a circular shape, and a diameter of 1 or more inches. 2. Description of the Prior Art Air slide transport means for wafers and similar articles are known in the art. For example, commonly assigned T. M. Byrne and A. Leoff, application Ser. No. 775,457, filed Nov. 13, 1968 now U.S. Pat. No. 3,588,176, discloses such a system.

A variety of article manipulating means have been employed in air slides and similar article transport systems. For example, U.S. Pat. No. 3,384,287 shows the use of detaining fingers movable into or out of engagement with an article path of travel. U.S. Pat. No. 3,270,881 shows the use of air jets for directing the flow of articles in an article transport system.

Apparatus for picking up such objects as semi-conductor wafers without physical contact to the wafer and relying on the Bernoulli principle is disclosed in commonly assigned Logue, U.S. Pat. No. 3,523,706.

In the fabrication of integrated circuits, semi-conductor (e.g., silicon) wafers undergo process treatments as a batch containing, e.g., 50 or 100 wafers loaded in a boat having a plurality of registration slots to hold the wafers in parallel relationship. A given area in, for example, a diffusion or oxidation furnace is maintained at precisely controlled conditions which must be identical for each wafer in order to permit batch processing. Since integrated circuits are fabricated on only one surface of a silicon wafer, it has been perceived that the number of silicon wafers that can be processed simultaneously in a given size of diffusion or oxidation furnace can be increased substantially if the wafers are stacked with their non-device surfaces in back-to-back relationship, allowing the surface of each wafer on which integrated circuits are fabricated to face outward.

Up to the present time, it has been necessary to load wafers in such a stacked relationship in an oxidation or diffusion boat by hand. Stacking and loading the wafers by hand is a time consuming procedure, likely to damage the sensitive integrated circuit surface of the wafers, and deters the use of back-to-back stacking for many high volume integrated circuit manufacturing operations. Further complications arise from the necessity to unstack the integrated circuit wafers once a processing operation on them has been completed, carry out a different processing operation, such as coating the wafers with photoresist, then again stack the semiconductor wafers at some later processing operation.

Thus, a need remains for further improvement in techniques for stacking and unstacking semiconductor wafers during their processing, in order to meet the needs of high volume integrated circuit production.

SUMMARY OF THE INVENTION

Accordingly, it is an object of this invention to provide a transport system for wafers capable of receiving them in an unstacked condition and stacking them during their path of travel through the transport system.

It is another object of this invention to provide a transport system for wafers which has the capability to receive them in a stacked condition and unstack them during their path of travel through the transport system.

It is a further object of the invention to provide a bi-directional transport system for wafers which will stack them during their path of travel in one direction through the transport system and unstack them during their path of travel in the other direction.

It is still another object of the invention to provide an air slide transport system for semiconductor wafers having a surface susceptible to damage by contact, in which the wafers may be stacked with their non-sensitive surfaces back-to-back during their path of travel, without contacting their sensitive surfaces before or after stacking.

It is yet another object of the invention to provide a bi-directional air slide transport system for unloading semiconductor wafers from a carrier, stacking them, and loading the stacked wafers into another carrier, then unloading the stacked wafers from their carrier, and returning the unstacked wafers to a carrier, all without contacting a surface susceptible to damage by contact of each wafer.

The attainment of these and related objects is achieved with the present wafer transport system. The system includes transport means for the wafers with means at one end of the transport means for receiving the wafers from the transport means. Means is provided intermediate the introducing means and the receiving means for stacking two wafers during their passage along the transport means.

In a preferred form, the means for stacking includes detaining means for the wafers movable into and out of the wafer path of travel. Secondly, means proximate to the detaining means for deflecting a second wafer over a first detained wafer in the wafer path of travel is provided to accomplish the stacking. In a preferred embodiment of the invention, the transport means is an air slide and the means for deflecting comprises at least one air jet having a component of velocity perpendicular to the wafer path of travel along the air slide.

If the transport means for the wafers is bi-directional, the system may additionally include means intermediate the introducing means and the receiving means for unstacking wafers during their passage along the transport means from the receiving means to the introducing means. In this reversed mode of operation, the function of the receiving means and the introducing means are reversed. A preferred embodiment of a means for unstacking the wafers has a first detaining means for the stacked wafers movable into and out of the stacked wafer path of travel. A second selectively actuable detaining means proximate to the first detaining means for one wafer of the stacked wafers acts to detain one of the stacked wafers and thereby separate it from the stack when the first detaining means is moved out of the stacked wafer path of travel. This second detaining means is preferably a Bernoulli pickup.

If the transport means is an air slide, air jets are used to deflect a second wafer over a first detained wafer to separate it from the stack. The transporting, stacking, and unstacking of the wafers may be accomplished without touching a surface of each wafer liable to damage by contact. In this embodiment, the invention is especially adapted for the handling of semiconductor wafers which must be stacked and unstacked, without significant yield losses to the integrated circuits due to abrasion and similar contact during their fabrication. However, it should be recognized that the present invention has application for transporting, stacking, and unstacking a wide variety of other types of wafers as well.

The foregoing and other objects, features, and advantages of the invention will be apparent from the following more particular description of a preferred embodiment of the invention, as illustrated in the accompanying drawings.

DESCRIPTION OF THE PREFERRED EMBODIMENT

Figure 1:
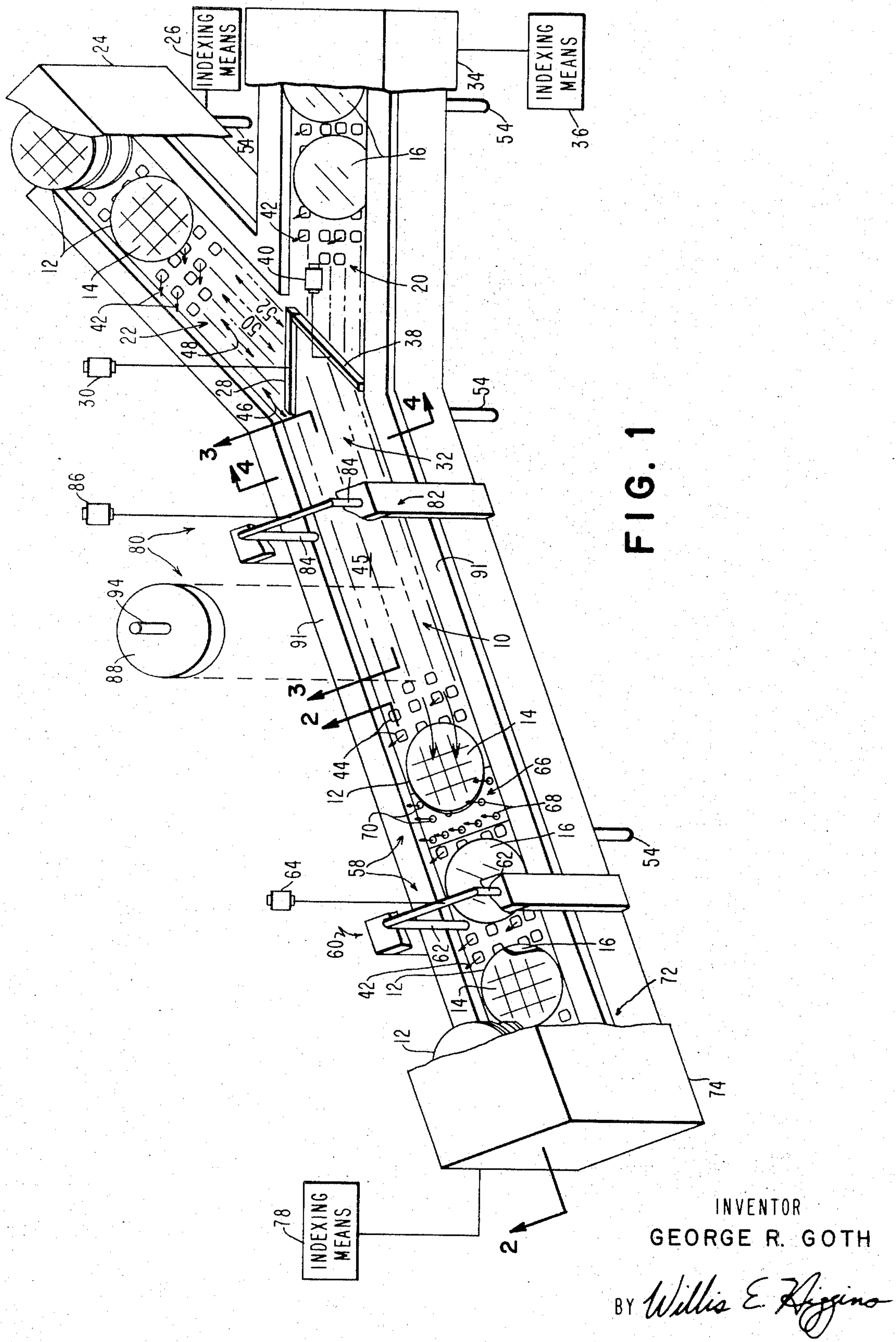
FIG. 1 is a perspective view of a wafer transport system in accordance with the invention, with partial breakaways to show detail.

Turning now to the drawings, more particularly to FIG. 1, there is shown a preferred embodiment of a wafer transport system in accordance with the invention. In the following discussion, the wafers are semiconductor wafers with one surface having integrated circuits in the process of fabrication and susceptible to damage by contact.

The system includes an air slide 10 along which semiconductor wafers 12 having their top surface 14 liable to damage by contact and semiconductor wafers 16 having their bottom surface 18 (shown in FIGS. 2A – 3B) liable to damage by contact, travel.

At one end, the air slide 10 is divided into two channels 20 and 22. Channel 22 is adapted to receive a wafer carrier 24 which may be indexed successively by indexing means 26 to supply wafers 12 having their top surface 14 liable to damage by contact one at a time. Gate 28 is movable into and out of the path of travel of wafers 12 by solenoid 30 at the exit of channel 22 to main air slide channel 32. Similarly, channel 20 has a carrier 34 successively indexible by indexing means 36 at its end, for introducing wafers 16 having bottom surface 18 liable to damage by contact to channel 20. Gate 38, controllable by solenoid 40, controls access of the wafers 16 to main channel 32 in the same manner as gate 28. The wafers 12 and 16 are moved along air slide 10 by air flow 42, which emanates from apertures 44 in surface 45 of air slide 10, arranged in four rows 46, 48, 50 and 52, respectively. Air flow 42 has a component in the direction it is desired to move wafers 12 or 16. The air slide 10 is bi-directional. Therefore, first and third rows 46 and 50, respectively, have their apertures angled to direct air flow 42 with a component of velocity from right to left, shown more clearly in FIGS. 2A and 2B, in order to move wafers 12 or 16 from right to left. Second and fourth rows 48 and 52, respectively, have their apertures 44 angled to direct air flow 42 from left to right, in order to transport wafers 12 or 16 from left to right.

Figure 3A:
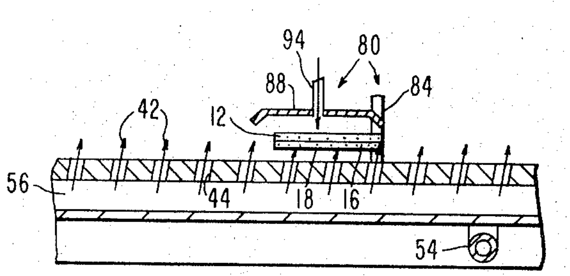
FIGS. 3A and 3B are cross sections of the apparatus taken along the line 3—3 in FIG. 1, showing wafers in two different positions during an unstacking operation.
Figure 3B:
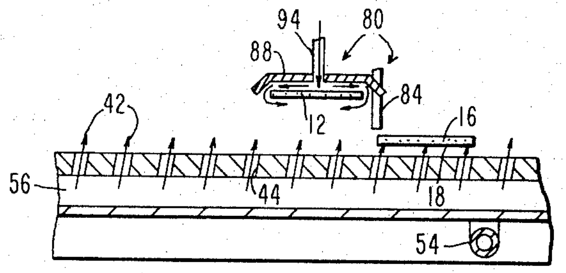
Figure 4:
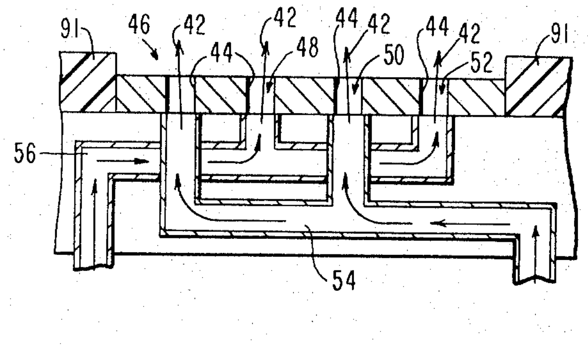
FIG. 4 is a cross section taken along the line 4—4 in FIG. 1, showing details of the bi-directional air slide mechanism.

FIG. 4 shows how the air flow 42 is selectively actuable to move the wafers 12 or 16 in a desired direction. First and third rows 46 and 50 of apertures 44 are connected to manifold 54 for providing air flow with a component of velocity from right to left in FIGS. 2A and 2B. Second and fourth rows 48 and 52 of apertures 44 are connected to manifold 56 for providing air flow having a component of velocity from left to right in FIGS. 3A and 3B. When air flow 42 is being provided by manifold 54, no air flow is provided by manifold 56, and vice versa.

Figures 2A, 2B:
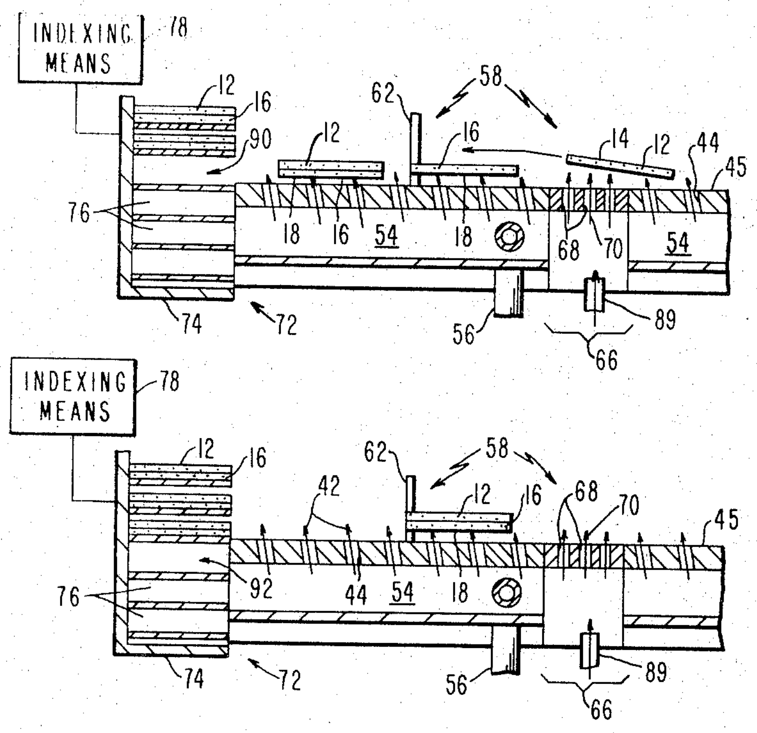
FIG. 2A is a section taken along the line 2—2 in FIG. 1.
FIG. 2B is a similar cross section taken along the line 2—2 in FIG. 1, but showing completion of a wafer stacking operation.

Means 58 for stacking the wafers 16 and 12 is shown in FIGS. 1 and 2A–2B. A detaining means 60 for the wafers 16 and 12 consists of pins 62 which are movable into and out of engagement with the path of travel of wafers 16 and 12 by solenoid 64. Section 66 of main air slide channel 32, located to the right of detaining means 60, has vertical apertures 68 for providing vertical air jets 70.

End 72 of main air slide channel 32, to the left of stacking means 58, is adapted to be engaged by wafer carrier 74, which has slots 76, shown in FIGS. 2A and 2B, for receiving stacked wafers 12 and 16. Indexing means 78 successively registers the slots 76 in proper position to receive the stacked wafers 12 and 16.

Means for unstacking wafers 12 and 16 is indicated generally by reference number 80 and is shown in FIGS. 1, 3A and 3B. Means 80 includes a first detaining means 82 movable into and out of engagement with the path of travel of wafers 12 and 16 on air slide 10. First detaining means 82 operates in the same manner as detaining means 60 in the stacking means 58, and has two pins 84 which are raised or lowered by solenoid 86. Bernoulli pickup 88 is selectively actuable to detain a wafer 12 when a stack of wafers 12 and 16 is detained by first detaining means 82.

In operation of the air slide 10, air flow 42 must be adjusted along the length of air slide 10 depending on whether wafers 12 and 16 moving along air slide 10 are stacked or unstacked. Independent manifolds 54 and 56 are therefore provided for each section of air slide 10. Additionally, independent air inlet 89 supplies air for jets 70 in section 66.

The operation of the wafer transport system will now be explained with reference to the passage of wafers 12 and 16 from carriers 24 and 34 to the means 58 for stacking, then transport of the stacked wafers 12 and 16 into carrier 74. The reverse operation will explain the operation of unstacking means 80.

The carrier 34 may be similar in design to carrier 74, shown in cross section in FIGS. 2A and 2B, and it contains a plurality of wafers 16 in parallel relationship and supported within the carrier 34 by their edges. In order to eject a wafer 16 from carrier 34, the carrier 34 is indexed downward by indexing means 36. As a result, a wafer 16 is brought into position slightly above the surface 45 of air slide 10. Air flow 42 having a right to left component of velocity, as shown in FIGS. 2A and 2B, raises the wafer 16 from its supports within carrier 34 and begins propelling it from right to left along channel 20. Wafer 16 is guided in its passage along air slide 10 by side rails 91, which the edges of the wafer 16 touch if the wafer moves to one side or the other of the air slide 10. The bottom surface 18 of wafer 16 at no time touches surface 45 of air slide 10. Solenoid 40 is energized to open gate 38, thus allowing the wafer 16 to pass into main channel 32 of air slide 10. At this point, solenoid 86 has been engaged in order to keep pins 84 of detaining means 82 out of the path of travel of the wafers 16 and 12. As the wafer 16 passes over insert 66 in main channel 32 of air slide 10, the wafer is lifted upwards by air jets 70, which have a higher velocity than air flow 42. At this time, solenoid 64 is not engaged, and pins 62 of detaining means 60 are interposed in the wafer path of travel, thus detaining wafer 16. If desired, air jets 70 in insert 66 may be turned off during passage of the wafer 16 to detaining means 60. However, it is simpler in operation to leave the air jets 70 turned on at all times.

Solenoid 40 is now turned off, allowing gate 38 to close, and solenoid 30 is turned on to open gate 28. Carrier 24 is now indexed downward by indexing means 26, thus releasing a wafer 12 from carrier 24 in the same manner as the wafer 16 was released from carrier 34. Air flow 42 now lifts the wafer 12, which has its top surface 14 susceptible to damage by contact, and moves it along channel 22 to main channel 32 of air slide 10, again without allowing the wafer 12 to contact surface 45 of air slide 10. As wafer 12 approaches insert 66, air jets 70 raise it above its normal path of travel, as shown more clearly in FIG. 2A. Wafer 16, which is still detained by pins 62 of detaining means 60, has settled back down to its normal height of travel along air slide 10. Wafer 12 therefore moves over wafer 16 and is halted by pins 62 of detaining means 60. Wafer 12 now settles gently down on top of wafer 16, as shown in FIG. 2B.

FIG. 2A shows previously stacked wafers 12 and 16 being transported along the remainder of main channel 32 beyond detaining means 60 into vacant slot 90 of carrier 74, to be loaded into the carrier as shown in FIG. 2B. Before the next stack of wafers 12 and 16 may be loaded into carrier 74, carrier 74 must be indexed upward by indexing means 78 to bring the next vacant slot 92 into position to receive the next stack of wafers 12 and 16. When this has been done, solenoid 64 is turned on to raise pins 62 of detaining means 60 out of the wafer path of travel, thus allowing the next stack of wafers 12 and 16 to move into carrier 74. Even though the wafers 12 and 16 are pushing against pins 62 with a certain force imparted to them by air flow 42, raising the pins 62 does not disturb the stacked relationship of wafers 12 and 16.

The transporting of wafers 16 and 12 along air slide 10, their stacking by stacking means 58, and their loading into carrier 74 continues until carrier 74 has been completely loaded with stacked wafers 12 and 16. An integrated circuit manufacturing operation which can be carried on wafers 12 and 16 stacked back-to-back, such as oxidation or diffusion, may now be carried out. For this purpose, carrier 74 is desirably made of a heat resistant material, such as quartz.

At the conclusion of this semiconductor manufacturing step, the semiconductor wafers 16 and 12 must be returned to their carriers 34 and 24, respectively, for further processing, such as photoresist application or oxide stripping. For this purpose, manifold 54, as shown most clearly in FIG. 4, which provides air flow 42 having a right to left component of velocity, is turned off, and air flow in manifold 56, which provides air flow 42 having a component of velocity from left to right is turned on. Carrier 74 containing stacked wafers 12 and 16 is positioned at the end 72 of main channel 32 of air slide 10. Carrier 74 is indexed downward by indexing means 78 in order to raise a stack of wafers 12 and 16 from its supports in carrier 74, thus allowing the stack to be moved from left to right in FIGS. 3A and 3B by air flow 42. For this operation, solenoid 64 is turned on, thus raising pins 62 of detaining means 60 out of the wafer path of travel. A stack of wafers 12 and 16 moves along channel 32 of air slide 10 until it reaches pins 84 of detaining means 82, which are in the wafer path of travel at this time.

With a stack of wafers 12 and 16 in the position shown in FIG. 3A, Bernoulli pickup 88 is turned on by the application of air to tube 94, thus causing the Bernoulli pickup to detain wafer 12. Further details on the operation of a Bernoulli pickup for semiconductor wafers is contained in previously referenced commonly assigned Logue, U.S. Pat. No. 3,523,706, the disclosure of which is incorporated by reference herein. Energization of solenoid 86 withdraws detaining pins 84 of detaining means 82 from the wafer path of travel, thus allowing wafer 16 to proceed along main channel 32 of air slide 10, as shown in FIG. 3B. Solenoid 40 is then engaged to open gate 38, allowing the wafer 16 to pass into channel 20 of air slide 10. Carrier 34 is indexed by indexing means 36 to provide a slot to receive the wafer 16.

Solenoid 40 is now turned off, allowing gate 38 to close and solenoid 30 is turned on, opening gate 28. Wafer 12 is now released by Bernoulli pickup 88, and it travels into channel 22 of air slide 10, for loading into carrier 24 as above.

It should now be apparent that a wafer transport system capable of attaining the stated objects has been described structurally and in operation. The system is capable of allowing wafer transport and stacking, as well as unstacking, to be carried out rapidly without significant reduction in integrated circuit yield because contact with the surface of each wafer susceptible to damage by contact is avoided. Because of its ease of operation, the present wafer transport system, stacking means and unstacking means should find wide application for other wafers than semiconductor wafers in other applications than the manufacture of integrated circuits.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A semiconductor wafer transport system comprising, in combination:

A. transport means for semiconductor wafers along which the wafers travel free of contact with a surface of the wafers liable to damage by contact, B. means at one end of said transport means for introducing a first wafer to said transport means with its surface liable to damage by contact facing downward and for introducing a second wafer to said transport means with its surface liable to damage by contact facing upward, C. means at the other end of said transport means for receiving wafers from said transport means, and D. means intermediate said introducing means and said receiving means for stacking the first and second wafers during their passage along said transport means, including means movable into and out of said transport means for detaining the first wafer and at least one air jet proximate said detaining means for raising the second wafer over said first detained wafer.

2. The system of claim 1 in which said transport means is an air slide.

3. The system of claim 1 in which said transport means is operable bi-directionally to pass said wafers from said receiving means to said introducing means, and wherein said system additionally comprises:

E. means intermediate said introducing means and said receiving means, for unstacking two wafers during their passage along said transport means from said receiving means to said introducing means.

4. The system of claim 3 wherein said means for unstacking comprises first means for detaining said stacked two wafers and second selectively actuable means proximate to said first detaining means for detaining one wafer of said stacked wafers.

5. The system of claim 4 wherein said second detaining means comprises a Bernoulli pickup.

6. In a wafer transport system, the improvement for stacking wafers during their passage in a path of travel along said system, comprising:

A. detaining means for the wafers movable into and out of the wafer path of travel, B. means, proximate to said detaining means, for deflecting a second wafer over a first detained wafer in the wafer path of travel, C. means for introducing the first wafer to the path of travel with a surface liable to damage by contact facing downward, and D. means for introducing the second wafer to the path of travel with a surface liable to damage by contact facing upward, said wafers being transported along said transport system free of contact with their surfaces which are liable to damage by contact.

7. The system of claim 6 in which said wafer transport system is an air slide.

8. The system of claim 7 wherein said means for deflecting is at least one air jet having a component of velocity perpendicular to the path of travel of the wafers along said air slide.

* * * * *